United States Patent
Murakami

(10) Patent No.: US 8,072,268 B2
(45) Date of Patent: Dec. 6, 2011

(54) OPERATIONAL AMPLIFIER

(75) Inventor: Tadamasa Murakami, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 12/685,000

(22) Filed: Jan. 11, 2010

(65) Prior Publication Data

US 2010/0182088 A1 Jul. 22, 2010

(30) Foreign Application Priority Data

Jan. 22, 2009 (JP) .................................. 2009-012242

(51) Int. Cl.
*H03F 3/45* (2006.01)
(52) U.S. Cl. .......................... 330/253; 330/258; 330/260
(58) Field of Classification Search .......... 330/252–261, 330/283
See application file for complete search history.

(56) References Cited

U.S. PATENT DOCUMENTS

| 7,215,199 B2 * | 5/2007 | Marholev ...................... 330/258 |
| 7,592,870 B2 * | 9/2009 | Wang et al. .................... 330/258 |
| 7,741,911 B2 * | 6/2010 | Kao et al. ...................... 330/261 |
| 2008/0315951 A1 * | 12/2008 | Rysinski et al. ............... 330/258 |

FOREIGN PATENT DOCUMENTS

JP 07-086850 3/1995

* cited by examiner

*Primary Examiner* — Hieu Nguyen
(74) *Attorney, Agent, or Firm* — Volentine & Whitt, PLLC

(57) ABSTRACT

An operational amplifier has an input stage that branches a first current according to first and second input signals. An output stage generates an output signal from a second current and one of the branch currents in the input stage. A first transistor supplies the first current to the input stage. A second transistor supplies the second current to the output stage. A first gate line supplies a first bias potential to the gate terminal of the first transistor. A second gate line supplies a second bias potential to the gate terminal of the second transistor. The first gate line and the second gate line are electrically isolated from each other, preventing unwanted feedback of the output signal to the input stage by leakage through the gate lines.

8 Claims, 2 Drawing Sheets

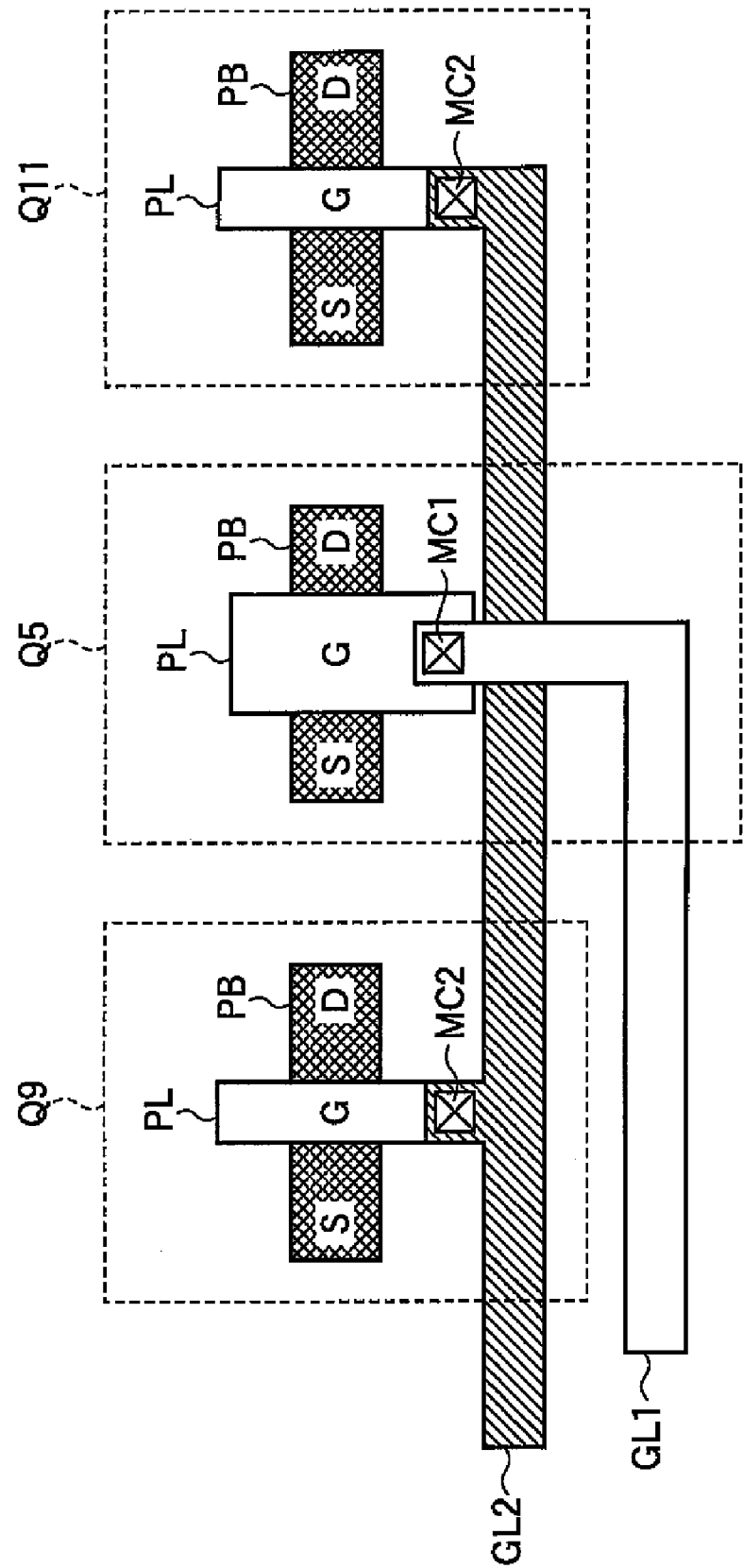

US 8,072,268 B2

OPERATIONAL AMPLIFIER

BACKGROUND OF THE INVENTION

1. Field of the Invention

The present invention relates to an operational amplifier such as, for example, a fully-differential operational amplifier having differential input and output stages.

2. Description of the Related Art

Fully-differential operational amplifiers are used for amplification of small signals because they provide immunity to supply voltage variations and external noise.

U.S. Pat. No. 5,844,442 to Brehmer (Japanese Patent Application Publication No. H7-086850) discloses a fully-differential complementary metal oxide semiconductor (CMOS) operational amplifier section having an input stage with inverting and non-inverting input terminals for receiving a differential pair of input signals, and an output stage with inverting and non-inverting output terminals for output of a differential pair of output signals. The input stage includes a pair of input transistors with gate terminals that receive the input signals and a pair of transistors that supply current to the input transistors. The output stage includes two pairs of output transistors that are controlled by potentials supplied by the input transistors so as to output a differential pair of output signals. The polarity of the differential pair of output signals is reverse to the polarity of the differential pair of input signals. The output stage also includes four transistors that supply current to the two pairs of output transistors. The gate terminals of two of these four transistors and the gate terminal of one of the two transistors that supply current to the input transistors are interconnected by a common gate line. The amount of current fed to the input and output transistors is regulated by a bias potential applied to the common gate line.

A problem in the above configuration is that the common mode component of the differential pair of output signals may leak onto the common gate line via the parasitic gate-drain capacitance of the transistors that regulate the current fed to the output transistors. This leakage affects the differential output signals by feedback through the input transistors, causing phase error in the output.

SUMMARY OF THE INVENTION

A general object of the present invention is to stabilize the operation of an operational amplifier by reducing phase error.

A more specific object is to reduce unwanted feedback from the output stage to the input stage of an operational amplifier.

The invention provides an operational amplifier for amplifying the difference between a first input signal and a second input signal. The input stage of the operational amplifier branches a first current in proportions responsive to first and second input signals. The output stage generates an output signal from a second current and one of the branch currents in the input stage. A first transistor supplies the first current to the input stage responsive to a first bias potential. A second transistor supplies the second current to the output stage responsive to a second bias potential.

A first gate line is connected to the gate terminal of the first transistor and supplies the first bias potential to the first transistor. A second gate line is connected to the gate terminal of the second transistor and supplies the second bias potential to the second transistor. The first gate line and the second gate line are electrically isolated from each other.

The isolation of the gate lines stabilizes the operation of the operational amplifier by eliminating unwanted feedback of the output signal to the input stage through the gate lines of the first and second transistors.

BRIEF DESCRIPTION OF THE DRAWINGS

In the attached drawings:

FIG. 2 shows an exemplary layout of the gate lines and three of the transistors in FIG. 1 on a semiconductor chip.

DETAILED DESCRIPTION OF THE INVENTION

Figure 1:
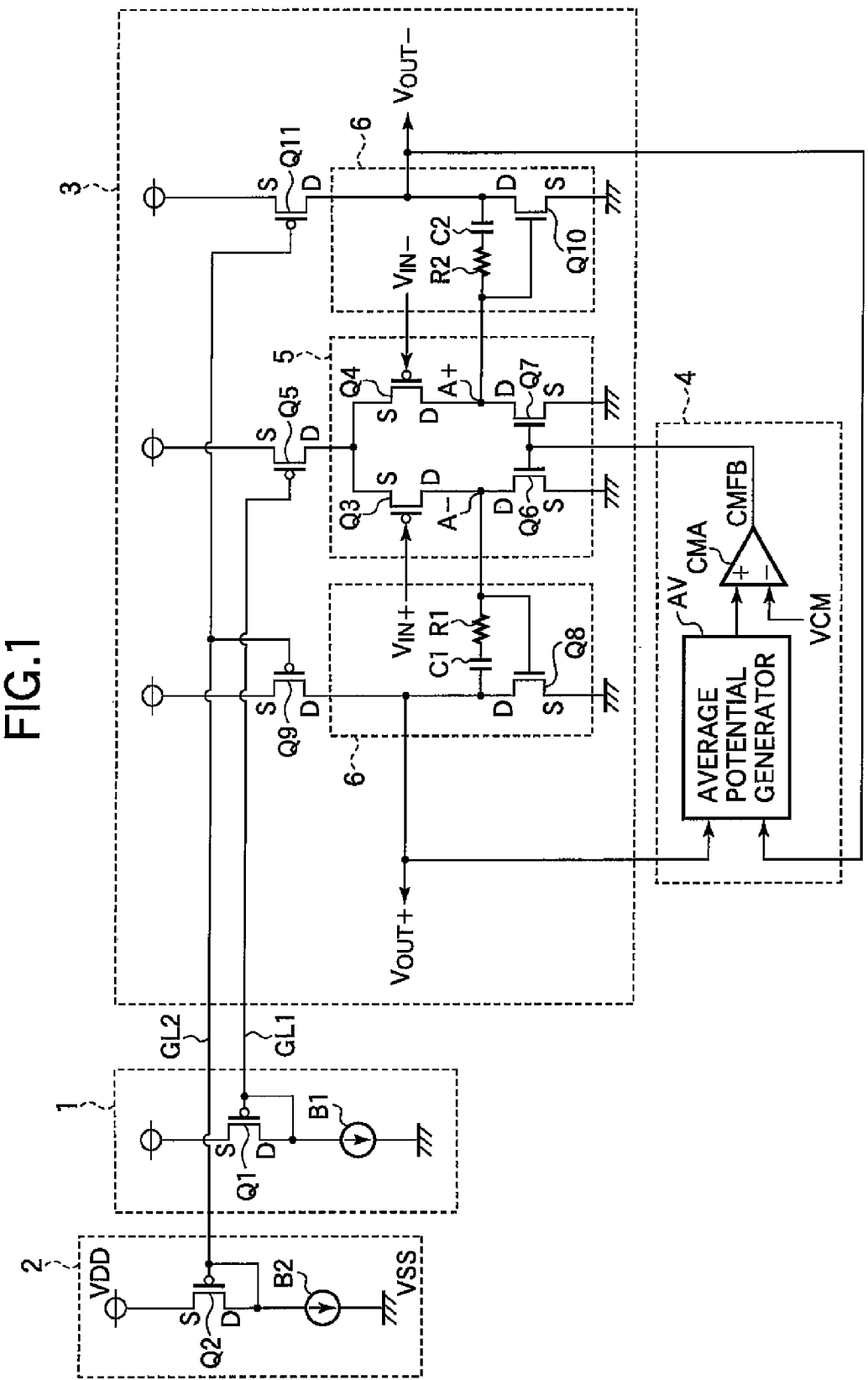
FIG. 1 is a circuit diagram showing the structure of an exemplary operational amplifier according to the invention.

An embodiment of the invention will now be described with reference to the attached drawings, in which like elements are indicated by like reference characters. The transistors shown in the drawings are metal-oxide-semiconductor (MOS) field-effect transistors.

A novel feature of this embodiment is that the gate line GL1 that supplies a bias potential to control the supply of current to the input stage and the gate line GL2 that supplies a bias potential to control the supply of current to the output stage are electrically isolated from each other.

Referring to FIG. 1, the fully-differential operational amplifier includes a first bias potential generator 1, a second bias potential generator 2, a differential amplifier section 3, and a common mode feedback section 4.

The first bias potential generator 1 includes a p-channel transistor Q1 having a source terminal S that receives a direct-current supply voltage VDD, a drain terminal D connected to a current source B1, and a gate terminal that, together with the drain terminal D, is connected to gate line GL1. The potential generated at the drain terminal D of transistor Q1 is supplied to the differential amplifier section 3 through gate line GL1 as a first bias potential.

The second bias potential generator 2 includes a p-channel transistor Q2 having a source terminal S that receives the direct-current supply voltage VDD, a drain terminal D connected to a current source B2, and a gate terminal that, together with the drain terminal D, is connected to gate line GL2. The potential generated at the drain terminal D of transistor Q2 is supplied to the differential amplifier section 3 through gate line GL2 as a second bias potential.

The differential amplifier section 3 includes p-channel transistors Q3, Q4, Q5, Q9, Q11, n-channel transistors Q6, Q7, Q8, Q10, capacitors C1, C2, and resistors R1, R2. Transistors Q3, Q4, Q6, and Q7 constitute the input stage 5. Transistors Q8 and Q10, capacitors C1 and C2, and resistors R1 and R2 constitute the output stage 6.

The gate terminal of transistor Q3 receives a non-inverting input signal $V_{IN+}$. The gate terminal of transistor Q4 receives an inverting input signal $V_{IN-}$. $V_{IN+}$ and $V_{IN-}$ form a differential pair of input signals. The source terminals S of transistors Q3 and Q4 are connected to the drain terminal D of transistor Q5, which supplies current to transistors Q3 and Q4. The drain terminal D of transistor Q3 is connected to the drain terminal D of transistor Q6 at a node A−. The drain terminal D of transistor Q4 is connected to the drain terminal D of transistor Q7 at a node A+. The gate terminal of transistor Q5 is connected to gate line GL1; the source terminal S of transistor Q5 receives the direct-current supply voltage VDD. The gate terminals of transistors Q6 and Q7 are mutually interconnected. The source terminals S of transistors Q6 and Q7 are both grounded. The ground potential is denoted by the conventional ground symbol and the letters VSS.

Node A− is connected to the gate terminal of transistor Q8, which generates a non-inverting output signal $V_{OUT+}$. The source terminal S of transistor Q8 is grounded; the drain terminal D of transistor Q8 is coupled to the gate terminal of transistor Q8 through capacitor C1 and resistor R1, which are connected in series. The drain terminal D of transistor Q8 is also connected to the drain terminal D of transistor Q9, which supplies current to transistor Q8. The non-inverting output signal $V_{OUT+}$ is output from a node at which transistors Q8 and Q9 are interconnected. Transistor Q9 has its gate terminal connected to gate line GL2, and its source terminal S receives the direct-current supply voltage VDD.

Node A+ is connected to the gate terminal of transistor Q10, which generates an inverting output signal $V_{OUT-}$. The source terminal S of transistor Q10 is grounded; the drain terminal D of transistor Q10 is coupled to the gate terminal of transistor Q10 through capacitor C2 and resistor R2, which are connected in series. The drain terminal D of transistor Q10 is also connected to the drain terminal D of transistor Q11, which supplies current to transistor Q10. The inverting output signal $V_{OUT-}$ is output from a node at which transistors Q10 and Q11 are interconnected. Transistor Q11 has its gate terminal connected to gate line GL2, and its source terminal S receives the direct-current supply voltage VDD.

The current supplied by transistor Q5 branches onto the path through transistor Q3 and the path through transistor Q4 in proportions responsive to the input signals $V_{IN+}$ and $V_{IN-}$ received at the gate terminals of transistors Q3 and Q4, and the resulting branch currents flow to ground through transistors Q6 and Q7. The voltage drops in transistors Q6 and Q7 produce respective potentials at nodes A− and A+. These potentials are supplied to the gate terminals of transistors Q8 and Q10, which conduct the currents supplied by transistors Q9 and Q11 to ground. The voltage drops in transistors Q8 and Q10 determine the potentials of the output signals $V_{OUT+}$ and $V_{OUT-}$. Variations in the input signals and $V_{IN}$ produce opposite variations in the currents and potentials at nodes A− and A+. Variations in the potentials at nodes A− and A+ produce opposite variations in the output signals $V_{OUT+}$ and $V_{OUT-}$. The output signals $V_{OUT+}$ and $V_{OUT-}$ form a differential pair, the difference between them being an amplified value of the difference between the input signals $V_{IN+}$ and $V_{IN-}$. The polarity of the output signals $V_{OUT+}$ and $V_{OUT-}$ is the same as the polarity of the input signals $V_{IN+}$ and $V_{IN-}$.

The common mode feedback section 4 includes an average potential generator AV and a differential amplifier or common mode amplifier CMA. The average potential generator AV calculates an average potential $(V_{OUT+}+V_{OUT-})/2$ halfway between the potentials of the non-inverting output signal $V_{OUT+}$ and inverting output signal $V_{OUT-}$, and supplies this average potential to the non-inverting input terminal of the differential amplifier CMA. The differential amplifier CMA supplies a halfway potential correction signal or common mode feedback signal CMFB with a potential equal to the difference between the average potential and a predetermined common mode reference potential VCM to the gate terminals of transistors Q6 and Q7.

The common mode feedback signal CMFB operates as a corrective signal that controls the conductivity of transistors Q6 and Q7 in the differential amplifier section 3. The potentials at nodes A− and A+ vary according to the common mode feedback signal CMFB, as well as to the branch currents conducted by transistors Q6 and Q7. A negative feedback loop is thereby established that holds the average of the potentials of the differential output signals $V_{OUT+}$ and $V_{OUT-}$ at a level matching the common mode reference potential VCM, stabilizing the input-output operating point of the fully-differential operational amplifier.

As stated above, the gate line GL1 that applies a bias potential to the transistor Q5 that supplies current to the input transistors Q3 and Q4 is electrically isolated from the gate line GL2 that applies a bias potential to the transistors Q9 and Q11 that supply current to the output transistors Q8 and Q10. Referring to the exemplary layout of transistors Q5, Q9, and Q11 shown in FIG. 2, each of these p-channel transistors includes p-type diffusion regions PB functioning as its source S and drain D and a polysilicon layer PL disposed above the channel between the source and gate diffusion regions PB, the polysilicon layer PL functioning as the gate terminal G. The polysilicon layer PL of transistor Q5 is connected through a metal contact MC1 to gate line GL1, which is made of aluminum or another metal wiring material. The polysilicon gate layers PL of transistors Q9 and Q11 are connected through metal contacts MC2 to gate line GL2, which is also made of aluminum or another metal wiring material, but is disposed in a different wiring layer from gate line GL1 and is insulated from gate line GL1 by a layer of dielectric material (not shown). Alternatively, gate lines GL1 and GL2 may be placed in the same metal wiring layer if the layout in FIG. 2 is changed so that gate lines GL1 and GL2 do not cross each other. In either case, the gate lines GL1 and GL2 are electrically isolated from each other by the dielectric material.

The circuit configuration and layout shown in FIGS. 1 and 2 does not prevent the common mode component of the output signals $V_{OUT+}$ and $V_{OUT-}$ from leaking onto gate line GL2 through the parasitic gate-drain capacitance of transistors Q9 and Q11, but it does prevent such common mode leakage from reaching gate line GL1. Accordingly, the common mode output component does not affect the operation of transistor Q5, and does not affect the operation of the input transistors Q3 and Q4 that receive current supplied by transistor Q5. The phase error that occurred in the prior art due to feedback of the common mode output component to the input stage 5 via leakage onto the common gate line is thereby avoided.

The invention is not limited to the embodiment shown in the drawings. For example, the invention may be practiced in a fully-differential operational amplifier that does not include the first bias potential generator 1 and the second bias potential generator 2 in FIG. 1 but uses externally supplied bias potentials instead. The only requirement is that the gate line GL2 connected to the gate of the transistor that supplies current to the input stage 5 and the gate line GL1 connected to the gates of the transistors that supply current to the output stage must be electrically isolated from each other, as shown in the exemplary layout in FIG. 2.

The invention may also be practiced in a single-ended operational amplifier that produces only one output signal, e.g., $V_{OUT+}$, from differential input signals.

Those skilled in the art will realize that other variations are possible within the scope of the invention, which is defined in the appended claims.

What is claimed is:

1. An operational amplifier for amplifying a difference between a first input signal and a second input signal, comprising:
   an input stage for generating branch currents from a first current in proportions responsive to the first input signal and the second input signal;
   an output stage for generating a first output signal from a second current and giving the output signal a potential responsive to one of the branch currents in the input stage;

a first transistor for supplying the first current to the input stage responsive to a first bias potential, the first transistor having a gate terminal for receiving the first bias potential;

a second transistor for supplying the second current to the output stage responsive to a second bias potential, the second transistor having a gate terminal for receiving the second bias potential;

a first gate line connected to the gate terminal of the first transistor, for supplying the first bias potential to the first transistor;

a second gate line connected to the gate terminal of the second transistor, for supplying the second bias potential to the second transistor;

a first bias potential generator connected to the first gate line, for generating the first bias potential; and a second bias potential generator connected to the second gate line, for generating the second bias potential wherein the first gate line and the second gate line are electrically isolated from each other, wherein the first bias potential generator comprises an eighth transistor having a gate terminal and a drain terminal both connected to the first gate line and a first current source connected to the drain terminal of the eighth transistor; and wherein the second bias potential generator comprises a ninth transistor having a gate terminal and a drain terminal both connected to the second gate line and a second current source connected to the drain terminal of the ninth transistor.

2. The operational amplifier of claim 1, wherein the output stage also generates a second output signal from a third current and gives the second output signal a potential responsive to another one of the branch currents generated by the input stage, the operational amplifier further comprising:

a third transistor for supplying the third current to the output stage responsive to the second bias potential, the third transistor having a gate terminal connected to the second gate line.

3. The operational amplifier of claim 2, further comprising a common mode feedback section for generating a common mode feedback signal responsive to a common mode component of the first and second output signals and supplying the common mode feedback signal to the input stage.

4. The operational amplifier of claim 3, wherein the common mode feedback section includes:

an average potential generator for generating a halfway potential halfway between the potentials of the first output signal and the second output signal; and a differential amplifier for amplifying a difference between the halfway potential and a reference potential to generate the common mode feedback signal.

5. The operational amplifier of claim 3, wherein the input stage includes a pair of fourth transistors both having gate terminals for receiving the common mode feedback signal, and passes the branch currents in parallel through the fourth transistors to generate respective branch potentials.

6. The operational amplifier of claim 5, wherein the input stage further includes:

a fifth transistor having a gate terminal for receiving the first input signal and having source and drain terminals for conducting said one of the branch currents from the first transistor to one of the fourth transistors; and a sixth transistor having a gate terminal for receiving the second input signal and having source and drain terminals for conducting said another one of the branch currents from the first transistor to another one of the fourth transistors.

7. The operational amplifier of claim 1, wherein the input stage generates respective branch potentials from the branch currents, and the output stage includes a seventh transistor having a gate terminal for receiving one of the branch potentials and a drain terminal for receiving the second current from the second transistor.

8. The operational amplifier of claim 1, further comprising a capacitor and a resistor coupled in series between the drain and gate terminals of the seventh transistor.

\* \* \* \* \*